United States Patent
Ching

(10) Patent No.: US 9,761,723 B2
(45) Date of Patent: Sep. 12, 2017

(54) STRUCTURE AND FORMATION METHOD OF FINFET DEVICE

(71) Applicant: Taiwan Semiconductor Manufacturing Co., Ltd, Hsin-Chu (TW)

(72) Inventor: Kuo-Cheng Ching, Zhubei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 14/592,591

(22) Filed: Jan. 8, 2015

(65) Prior Publication Data

US 2016/0204260 A1    Jul. 14, 2016

(51) Int. Cl.
| | |
|---|---|
| *H01L 29/78* | (2006.01) |
| *H01L 29/66* | (2006.01) |
| *H01L 21/02* | (2006.01) |
| *H01L 29/423* | (2006.01) |
| *H01L 29/165* | (2006.01) |

(52) U.S. Cl.
CPC .... *H01L 29/7851* (2013.01); *H01L 21/02236* (2013.01); *H01L 29/42376* (2013.01); *H01L 29/66545* (2013.01); *H01L 29/66795* (2013.01); *H01L 29/165* (2013.01); *H01L 29/7848* (2013.01)

(58) Field of Classification Search
CPC ....... H01L 29/78; H01L 27/088; H01L 29/10; H01L 29/06; H01L 29/66; H01L 21/02; H01L 29/423

USPC .......................................... 257/401; 438/283
See application file for complete search history.

(56) References Cited

U.S. PATENT DOCUMENTS

| | | | | |
|---|---|---|---|---|
| 8,129,777 | B2 * | 3/2012 | Kim ................. | H01L 29/42392 257/327 |
| 2005/0156202 | A1 * | 7/2005 | Rhee ................. | H01L 29/7853 257/213 |
| 2013/0234215 | A1 * | 9/2013 | Okano ............. | H01L 29/42392 257/255 |
| 2014/0312432 | A1 | 10/2014 | Ching et al. | |

FOREIGN PATENT DOCUMENTS

JP          2014038898 A    *  2/2014

* cited by examiner

*Primary Examiner* — Asok K Sarkar
*Assistant Examiner* — Dmitriy Yemelyanov
(74) *Attorney, Agent, or Firm* — Birch, Stewart, Kolasch & Birch, LLP

(57) ABSTRACT

Structures and formation methods of a semiconductor device structure are provided. The semiconductor device structure includes a semiconductor substrate and a fin channel structure over the semiconductor substrate. The semiconductor device structure also includes a gate stack covering a portion of the fin channel structure. The semiconductor device structure further includes a source/drain structure adjacent to the fin channel structure and a doped region between the semiconductor substrate and the fin channel structure. In addition, the semiconductor device structure includes a blocking layer between the fin channel structure and the doped region.

20 Claims, 25 Drawing Sheets

STRUCTURE AND FORMATION METHOD OF FINFET DEVICE

BACKGROUND

The semiconductor integrated circuit (IC) industry has experienced rapid growth. Continuing advances in semiconductor manufacturing processes have resulted in semiconductor devices with finer features and/or higher degrees of integration. Functional density (i.e., the number of interconnected devices per chip area) has generally increased while feature size (i.e., the smallest component that can be created using a fabrication process) has decreased. This scaling-down process generally provides benefits by increasing production efficiency and lowering associated costs.

Despite groundbreaking advances in materials and fabrication, scaling planar devices such as a metal-oxide-semiconductor field effect transistor (MOSFET) device has proven challenging. To overcome these challenges, circuit designers look to novel structures to deliver improved performance, which has resulted in the development of three-dimensional designs, such as fin-like field effect transistors (FinFETs). The FinFET is fabricated with a thin vertical "fin" (or fin structure) extending up from a substrate. The channel of the FinFET is formed in this vertical fin. A gate is provided over the fin to allow the gate to control the channel from multiple sides. Advantages of the FinFET may include a reduction of the short channel effect, reduced leakage, and higher current flow.

However, since feature sizes continue to decrease, fabrication processes continue to become more difficult to perform. Therefore, it is a challenge to form a reliable semiconductor device including the FinFET.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
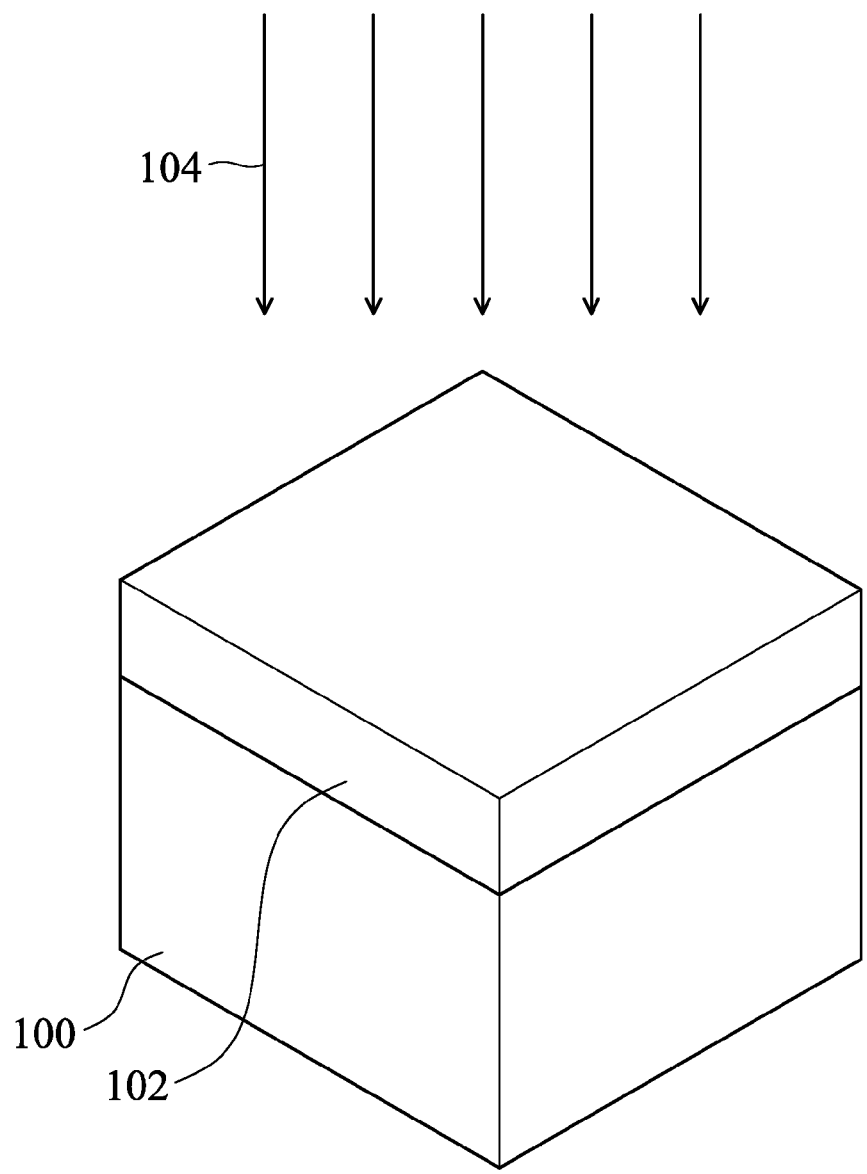
FIGS. 1-6 are perspective views of various stages of a process for forming a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. FIGS. 1-6 are perspective views of various stages of a process for forming a semiconductor device structure, in accordance with some embodiments. Additional operations can be provided before, during, and/or after the stages described in FIGS. 1-6. FIGS. 7A, 8A, 9A, 10A, 11A, 12A, 13A, 14A and 15A are perspective views of various stages of a process for forming a semiconductor device structure, in accordance with some embodiments. FIGS. 7B, 8B, 9B, 10B, 11B, 12B, 13B, 14B, and 15B are cross-sectional views of a process for forming a semiconductor device structure, in accordance with some embodiments. FIGS. 7B, 8B, 9B, 10B, 11B, 12B, 13B, 14B, and 15B are cross-sectional views each respectively showing a portion of the structures shown in FIGS. 7A, 8A, 9A, 10A, 11A, 12A, 13A, 14A and 15A, in accordance with some embodiments. Some of the stages that are described can be replaced or eliminated for different embodiments. Additional features can be added in the semiconductor device. Some of the features described below can be replaced or eliminated for different embodiments.

As shown in FIG. 1, a semiconductor substrate 100 is provided. In some embodiments, the semiconductor substrate 100 is a bulk semiconductor substrate. The bulk semiconductor substrate may be a semiconductor wafer such as a silicon wafer. In some embodiments, the semiconductor substrate 100 includes an elementary semiconductor material such as silicon or other elementary semiconductor materials such as germanium. In some other embodiments, the semiconductor substrate 100 includes a compound semiconductor. The compound semiconductor may include silicon carbide, gallium arsenide, indium arsenide, indium phosphide, another suitable compound semiconductor, or a combination thereof.

In some embodiments, the semiconductor substrate 100 is a semiconductor-on-insulator (SOI) substrate. The SOI substrate may be fabricated by using a separation by implantation of oxygen (SIMOX) process, a wafer bonding process, another applicable method, or a combination thereof.

As shown in FIG. 1, a doped region 102 is formed on the semiconductor substrate 100, in accordance with some embodiments. In some embodiments, the doped region 102 is an anti-punch-through (APT) region. The APT region may be used to offer greater protection against the punch-through phenomena. As a result, current leakage caused by the punch-through phenomena may be reduced or prevented. In some embodiments, an ion implantation process 104 is performed to dope an upper portion of the semiconductor substrate 100 with suitable dopants for forming the doped region 102, as shown in FIG. 1. In some embodiments, since the ion implantation process for forming the APT region is performed before the formation of fin structures or fin channel structures, the fin structures or fin channel structures are prevented from being damaged or negatively affected by the ion implantation process. Device quality and reliability are therefore improved.

In some embodiments, the concentration of dopants in the doped region 102 is in a range from about 1E18 atoms/cm$^3$ to about 1E19 atoms/cm$^3$. In some other embodiments, the concentration of the dopants in the doped region 102 is in a range from about 5E18 atoms/cm$^3$ to about 1E20 atoms/cm$^3$. Because the doped region 102 is formed before the formation of the fin structures or fin channel structures, the concentration of dopants in the doped region 102 may be increased depending on requirements. Even if the concentration of dopants is increased, the fin structures or fin channel structures are still prevented from being damaged or negatively affected since the ion implantation process is performed before the fin structures or fin channel structures are formed.

In some embodiments, the doped region 102 is a p-type doped region. The doped region 102 may be a portion of the semiconductor substrate 100 doped with one or more p-type dopants. The p-type dopant(s) include(s), for example, boron. In some of these cases, one or more NMOS FinFET devices will be formed over the doped region 102.

In some other embodiments, the doped region 102 is an n-type doped region. The doped region 102 may be a portion of the semiconductor substrate 100 doped with one or more n-type dopants. The n-type dopant(s) include(s), for example, phosphor or arsenic. In some of these cases, one or more PMOS FinFET devices will be formed over the doped region 102.

Figure 2:
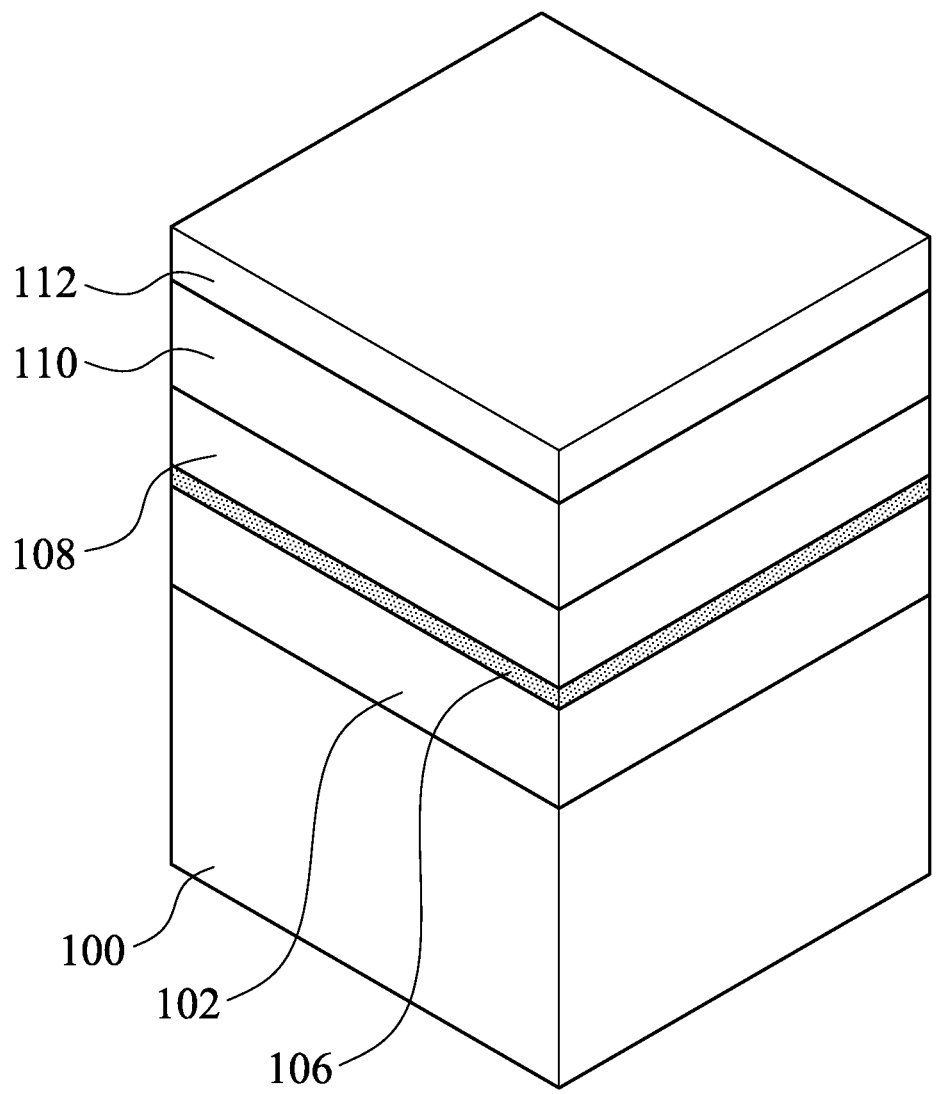

Referring to FIG. 2, a blocking layer 106 is deposited over the doped region 102, in accordance with some embodiments. The blocking layer is configured to block or prevent dopants in the doped region 102 from entering material layers or elements which will be formed over the blocking layer 106. In some embodiments, the blocking layer 106 is made of silicon carbide, silicon germanium carbide, silicon, another suitable blocking material, or a combination thereof. In some embodiments, the blocking layer 106 substantially contains no nitrogen. In some embodiments, the blocking layer 106 substantially contains no oxygen.

In some embodiments, the blocking layer 106 is made of silicon carbide. In these cases, the blocking layer 106 may have an atomic concentration of carbon that is in a range from about 0.2% to about 1%. However, in some other embodiments, the blocking layer 106 contains substantially no carbon. In some other embodiments, the blocking layer 106 is made of silicon germanium carbide. In these cases, the blocking layer 106 may have an atomic concentration of carbon that is in a range from about 0.3% to about 1%. However, in some other embodiments, the blocking layer 106 contains substantially no carbon. The blocking layer 106 may also have an atomic concentration of germanium that is in a range from about 10% to about 50%.

In some cases, the atomic concentration of carbon in the blocking layer 106 should not be greater than about 1%. If the atomic concentration of carbon is greater than about 1%, a subsequent formation process (such as an epitaxial growth) for forming a semiconductor material on the blocking layer 106 may be hard to perform. However, embodiments of the disclosure are not limited thereto. In some other cases, the atomic concentration of carbon in the blocking layer 106 may be greater than about 1%.

In some cases, the atomic concentration of germanium in the blocking layer 106 should not be greater than about 50%. If the atomic concentration of germanium is greater than about 50%, the quality and reliability of the device may be negatively affected. For example, leakage current may increase if the blocking layer 106 contains too much germanium. However, embodiments of the disclosure are not limited thereto. In some other cases, the atomic concentration of germanium in the blocking layer 106 may be greater than about 50%.

In some embodiments, the blocking layer 106 has a thickness that is in a range from about 3 nm to about 10 nm. Many deposition methods may be used to form the blocking layer 106. The deposition methods may include a chemical vapor deposition (CVD) process, an atomic layer deposition (ALD) process, a physical vapor deposition (PVD) process, a spin-on process, an epitaxial growth process, another applicable process, or a combination thereof.

As shown in FIG. 2, a first semiconductor layer 108, a second semiconductor layer 110, and a hard mask layer 112 are deposited over the blocking layer 106, in accordance with some embodiments. In some embodiments, the semiconductor layers 108 and 110 are made of different materials. In some embodiments, the semiconductor layer 108 is made of a semiconductor material that is more easily oxidized than that of the semiconductor layer 110 under the same atmosphere for oxidation. In some embodiments, the semiconductor layer 108 is made of silicon germanium, and the semiconductor layer 110 is made of silicon.

In some embodiments, the semiconductor layers 108 and 110 are formed using an epitaxial growth operation. Each of the semiconductor layers 108 and 110 may be formed using a selective epitaxial growth (SEG) process, a CVD process (e.g., a vapor-phase epitaxy (VPE) process, a low pressure chemical vapor deposition (LPCVD) process, and/or an ultra-high vacuum CVD (UHV-CVD) process), a molecular beam epitaxy process, another applicable process, or a combination thereof. In some embodiments, the semiconductor layers 108 and 110 are grown in-situ in the same process chamber.

The hard mask layer 112 is used to assist in the patterning of the semiconductor layers 108 and 110. In some embodiments, the hard mask layer 112 includes multiple sub-layers. The hard mask layer 112 may include a dielectric material, a metal material, another suitable material, or a combination thereof. In some embodiments, the hard mask layer 112 is made of silicon nitride, silicon oxide, silicon carbide, silicon oxynitride, titanium nitride, titanium, another suitable material, or a combination thereof. In some embodiments, the hard mask layer 112 is deposited using a CVD process, a PVD process, a spin-on process, an electroplating process, another applicable process, or a combination thereof. Many variations or modifications may be made to embodiments of the disclosure. In some other embodiments, the hard mask layer 112 is not formed.

Figure 3:
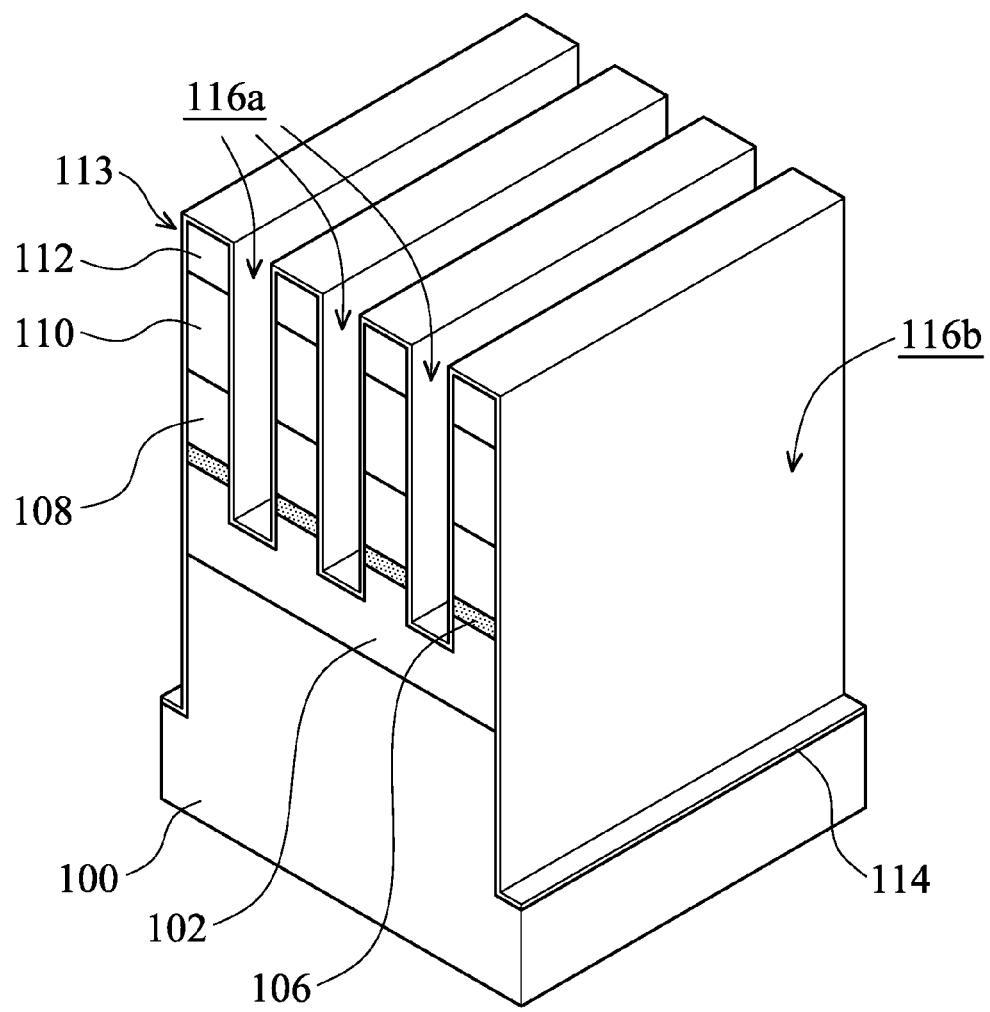

Referring to FIG. 3, multiple recesses 116a and 116b are formed to pattern the semiconductor layers 110 and 108 and the semiconductor substrate 100 into multiple fins 113, in accordance with some embodiments. In some embodiments, multiple photolithography processes and etching processes are performed to form the recesses 116a and 116b. In some embodiments, the recess 116b is deeper than the recess 116a. The recess 116b may be used to separate two neighboring FinFET devices. The recesses 116a and 116b may be formed in different etching processes.

As shown in FIG. 3, a liner layer 114 is deposited over sidewalls and bottom portions of the recesses 116a and 116b, in accordance with some embodiments. In some embodiments, the liner layer 114 is conformally deposited. The liner layer 114 may be used to reduce crystalline defects at the interface between the fins 113 and an isolation feature which will be subsequently formed in the recesses 116a and 116b. In some embodiments, the liner layer 114 is made of silicon nitride, silicon oxynitride, another suitable material, or a combination thereof. The liner layer 114 may be deposited using a CVD process, an ALD process, a spin-on process, another applicable process, or a combination thereof.

Figure 4:
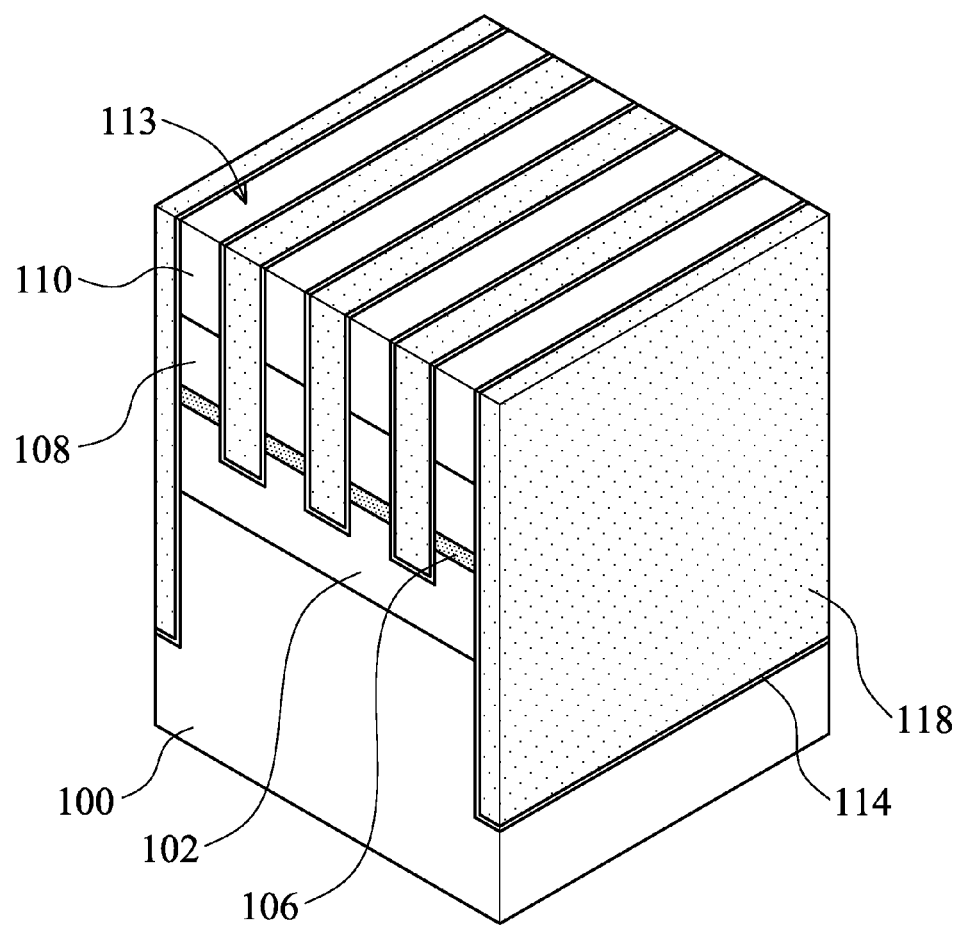

Referring to FIG. 4, an isolation feature 118 is formed in the recesses 116a and 116b, in accordance with some embodiments. The isolation feature 118 is used to define and electrically isolate various device elements formed in and/or over the semiconductor substrate 100. In some embodiments, the isolation feature 118 includes shallow trench isolation (STI) features, local oxidation of silicon (LOCOS) features, another suitable isolation feature, or a combination thereof.

In some embodiments, the isolation feature 118 is made of a dielectric material. The dielectric material may include silicon oxide, silicon nitride, silicon oxynitride, fluoride-doped silicate glass (FSG), low-K dielectric material, other suitable materials, or a combination thereof. In some embodiments, a dielectric material layer is deposited over the semiconductor substrate 100. The dielectric material layer covers the fins 113 and fills the recesses 116a and 116b. In some embodiments, the dielectric material layer is deposited using a chemical vapor deposition (CVD) process, a spin-on process, another applicable process, or a combination thereof.

In some embodiments, a planarization process is performed afterwards to thin the dielectric material layer until the fins 113 are exposed. As a result, the isolation feature 118 is formed. In some embodiments, the hard mask layer 112 and portions of the liner layer 114 are also removed by the planarization process. The planarization process may include a chemical mechanical polishing (CMP) process, a grinding process, an etching process, another applicable process, or a combination thereof. As shown in FIG. 4, the fins 113 are surrounded by the isolation feature 118 at this stage.

Figure 5:
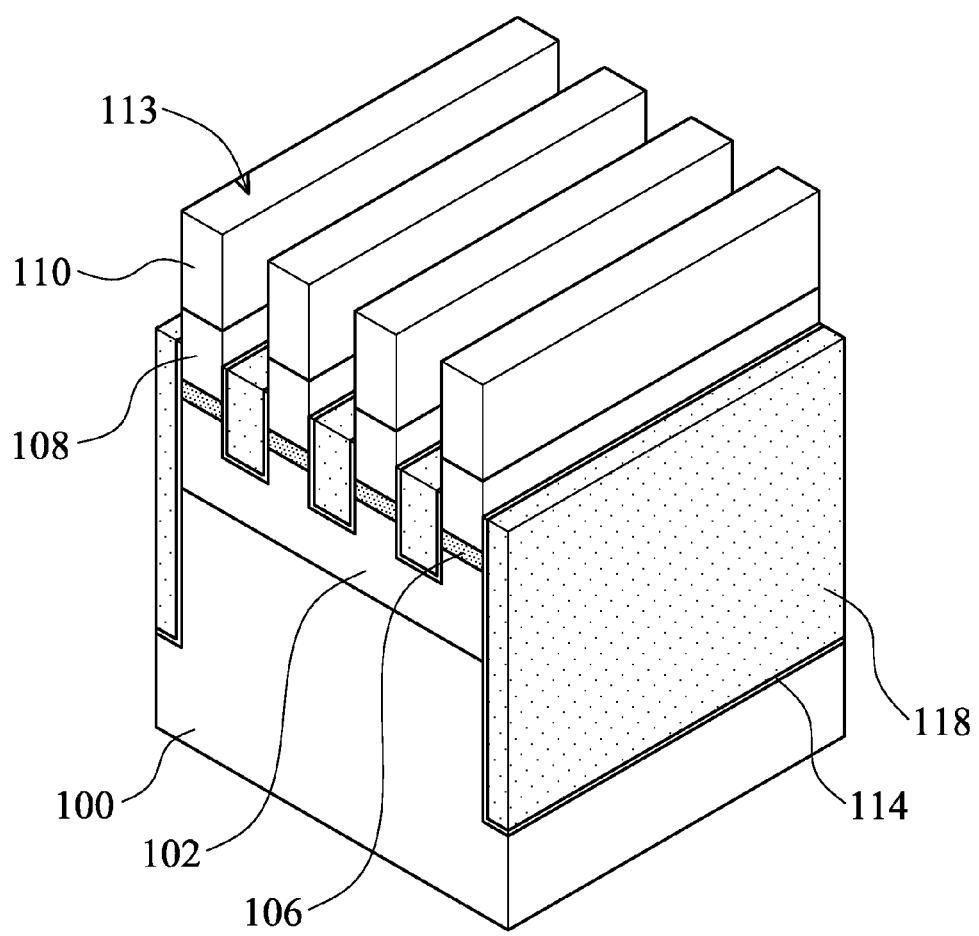

As shown in FIG. 5, upper portions of the isolation feature 118 and the liner layer 114, which originally surround the fins 113, are removed, in accordance with some embodiments. As a result, the fins 113 protrude from the top surface of the isolation feature 118, as shown in FIG. 5. In some embodiments, one or more etching operations are used to recess the isolation feature 118 and the liner layer 114. In some embodiments, the semiconductor layer 110 is not surrounded or covered by the isolation feature 118 after the recessing of the isolation feature 118, as shown in FIG. 5. In some embodiments, after the recessing of the isolation feature 118, lower portions of the semiconductor layer 108 are still surrounded or covered by the isolation feature 118 while upper portions of the semiconductor layer 108 are not, as shown in FIG. 5.

Figure 6:
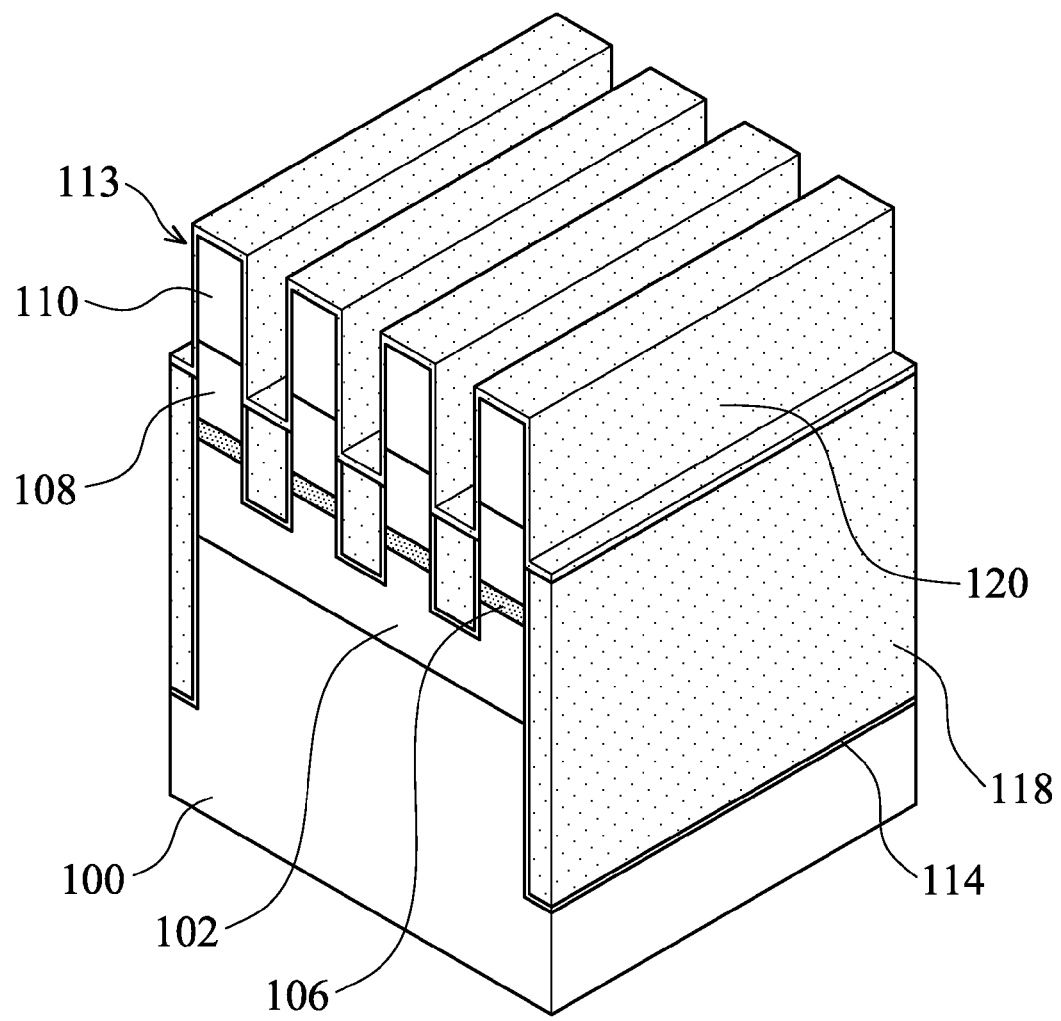

As shown FIG. 6, a dummy layer 120 is deposited over top portions and sidewalls of the fins 113, in accordance with some embodiments. The dummy layer 120 may serve as an etch stop layer during subsequent etching processes. In some embodiments, the dummy layer 120 is made of a dielectric material. For example, the dummy layer 120 is made of silicon oxide. In some embodiments, the dummy layer 120 is conformally deposited over the fins 113. The dummy layer 120 may be deposited using a CVD process, an ALD process, a PVD process, a spin-on process, another applicable process, or a combination thereof.

As shown in FIG. 7, a dummy gate stack 125 is formed over the isolation feature 118 and a portion of the fins 113, in accordance with some embodiments. The portions of the semiconductor layer 110 surrounded by the dummy gate stack 125 serve as fin channel structures. In some embodiments, the dummy gate stack 125 includes the dummy layer 120, a dummy gate electrode 122, and hard masks 124a and 124b. In some embodiments, the dummy gate electrode 122 is made of polysilicon. The hard masks 124a and 124b may be used to assist in the patterning process for forming the dummy gate stack 125. In some embodiments, the hard masks 124a and 124b are made of different materials. The hard masks 124a and 124b may be made of silicon oxide, silicon nitride, silicon oxynitride, silicon carbide, another suitable material, or a combination thereof. Many variations and modifications can be made to embodiments of the disclosure. In some other embodiments, the hard masks 124a and 124b are not formed.

In some embodiments, a dummy gate electrode layer and one or more hard mask layers are deposited over the dummy layer 120. In some embodiments, the gate dummy electrode layer and the hard mask layers are sequentially deposited by using suitable deposition methods. The suitable deposition methods may include a chemical vapor deposition (CVD) process, an atomic layer deposition (ALD) process, a thermal oxidation process, a physical vapor deposition (PVD) process, another applicable process, or a combination thereof. Afterwards, a photolithography process and an etching process are performed to pattern the hard mask layers so as to form the hard mask s 124a and 124b.

Figure 7A:
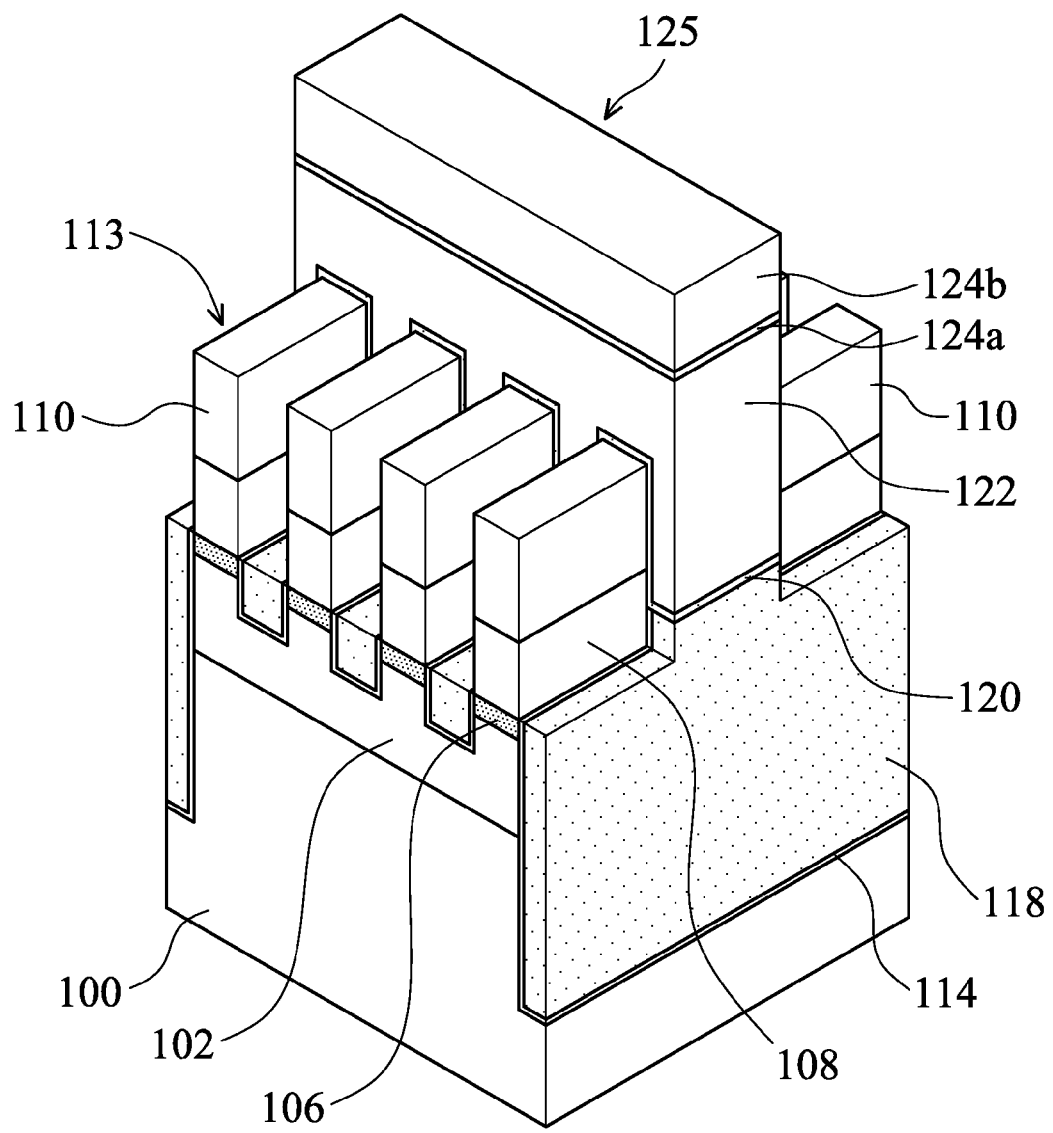
FIGS. 7A, 8A, 9A, 10A, 11A, 12A, 13A, 14A and 15A are perspective views of various stages of a process for forming a semiconductor device structure, in accordance with some embodiments.
Figure 7B:
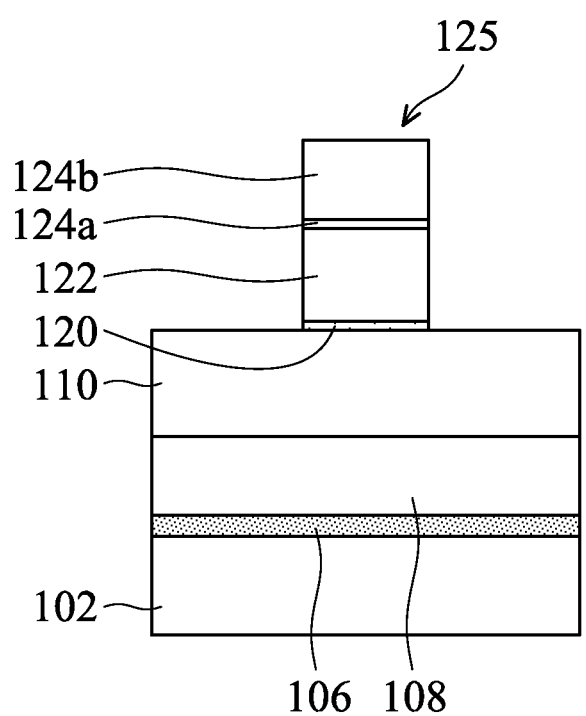
FIGS. 7B, 8B, 9B, 10B, 11B, 12B, 13B, 14B, and 15B are cross-sectional views of a process for forming a semiconductor device structure, in accordance with some embodiments.

With the assistance of the hard masks 124a and 124b, the gate dummy electrode layer is patterned. As a result, the dummy gate electrode 122 is formed. During the etching process for forming the dummy gate electrode 122, the dummy layer 120 may serve as an etch stop layer to protect the fins 113 under the dummy layer 120. Afterwards, the portions of the dummy layer 120 that are not covered by the dummy gate electrode 122 are removed using, for example, another etching process. As a result, the dummy layer 120 is patterned, and the dummy gate stack 125 is formed, as shown in FIGS. 7A and 7B.

Figure 8A:
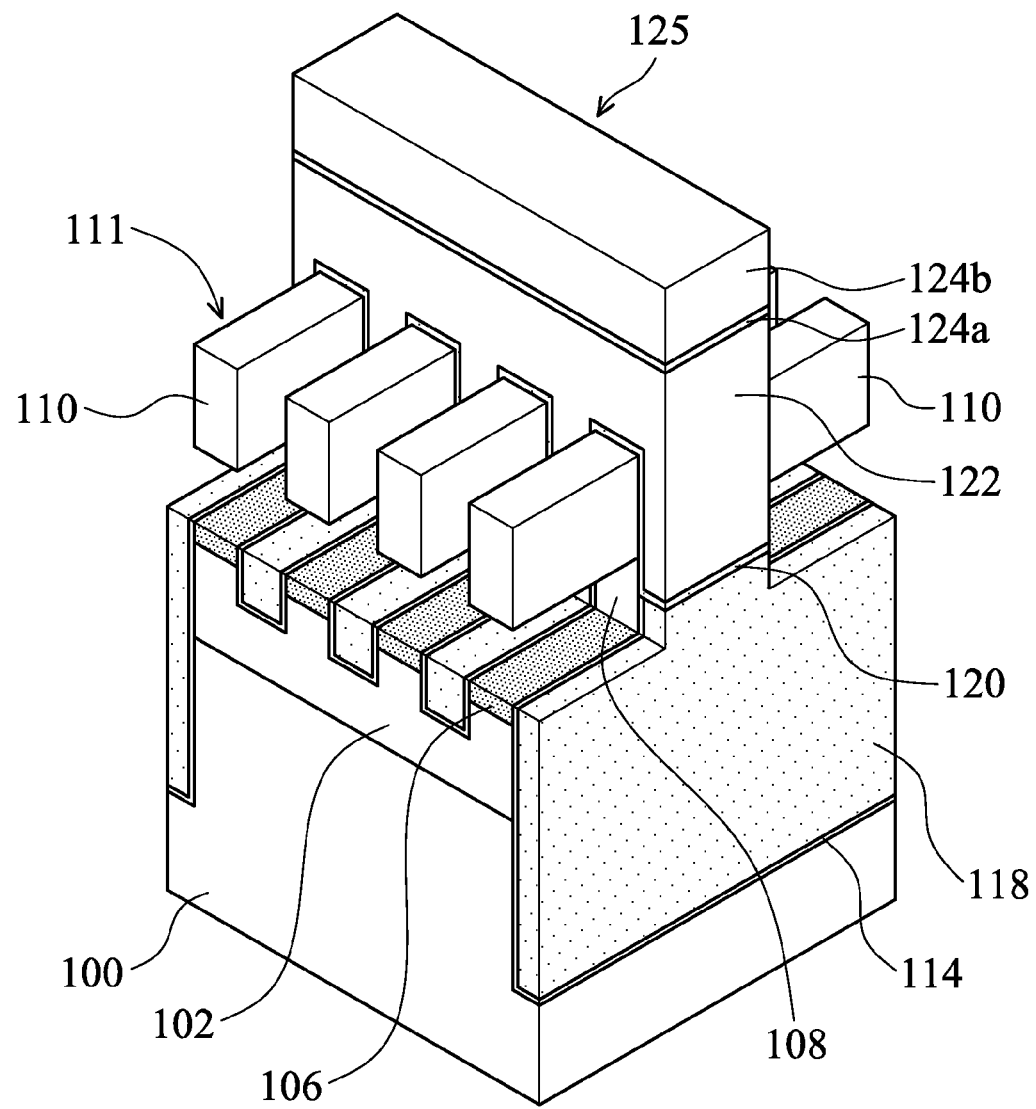
Figure 8B:
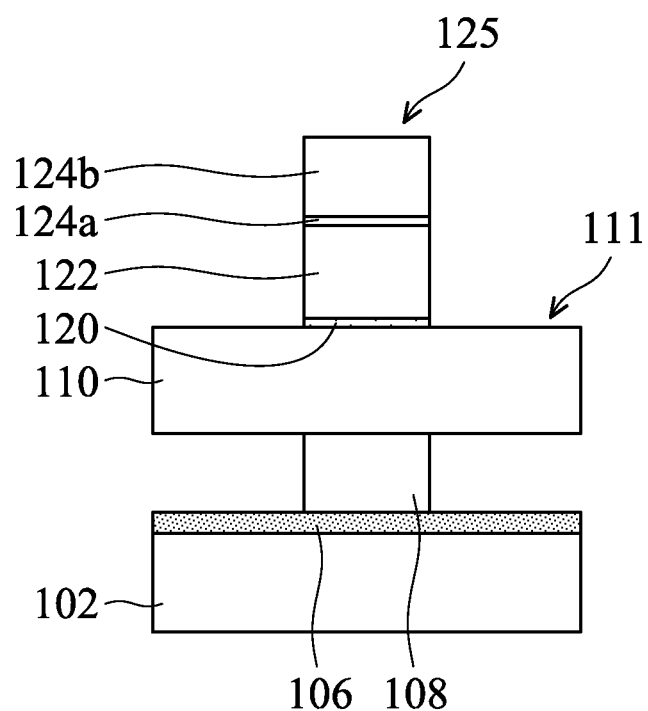

As shown in FIGS. 8A and 8B, portions of the semiconductor layer 108 not under the gate stack 124 are removed, in accordance with some embodiments. In some embodiments, an etching process is used to partially remove the semiconductor layer 108. As a result, the blocking layer 106 is exposed, as shown in FIGS. 8A and 8B. In some embodiments, the etch selectivity between the semiconductor layer 110 and the semiconductor layer 108 is high. Therefore, the semiconductor layer 110 remains. As shown in FIGS. 8A and 8B, fin structures 111 constructed by the semiconductor layer 110 are formed. Each of the fin structures 111 is separated from the blocking layer 106.

Figure 9A:
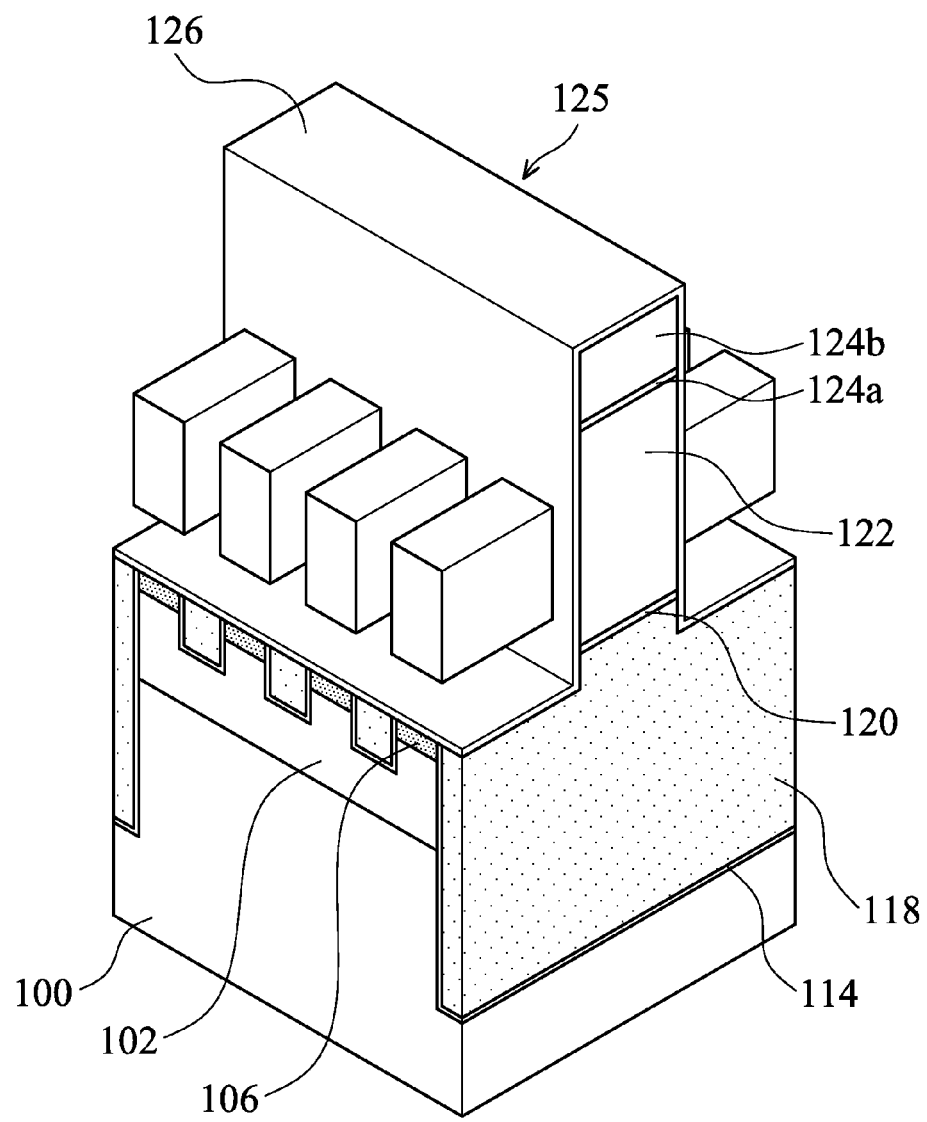
Figure 9B:
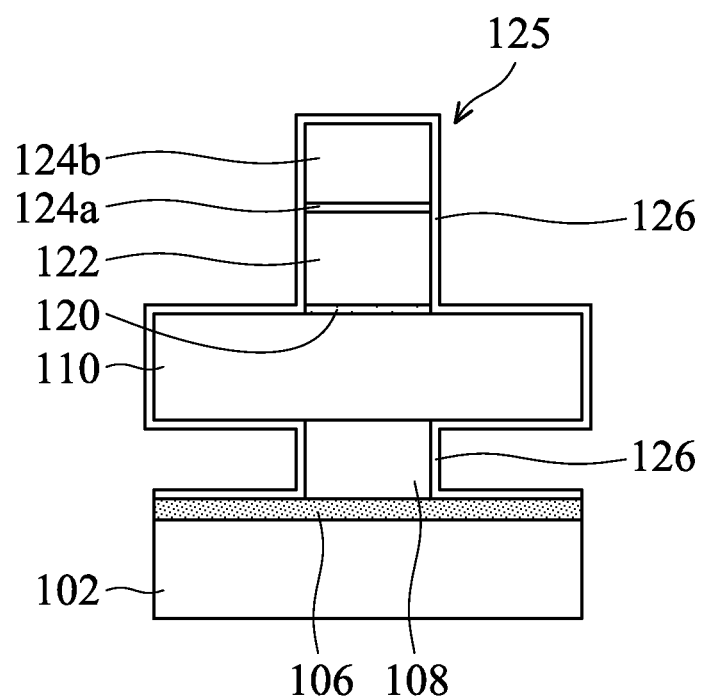

Referring to FIGS. 9A and 9B, a spacer layer 126 is deposited over the structure shown in FIGS. 8A and 8B, in accordance with some embodiments. In some embodiments, the spacer layer 126 is conformally deposited. In some embodiments, the spacer layer 126 is made of a dielectric material. The dielectric material may include silicon carbon nitride, silicon nitride, silicon oxynitride, another suitable dielectric material, or a combination thereof. The spacer layer 126 may have a thickness that is in a range from about 2 nm to about 10 nm. In some embodiments, the spacer layer 126 is deposited using a CVD process, an ALD process, a spin-on process, another applicable process, or a combination thereof.

Figure 10A:
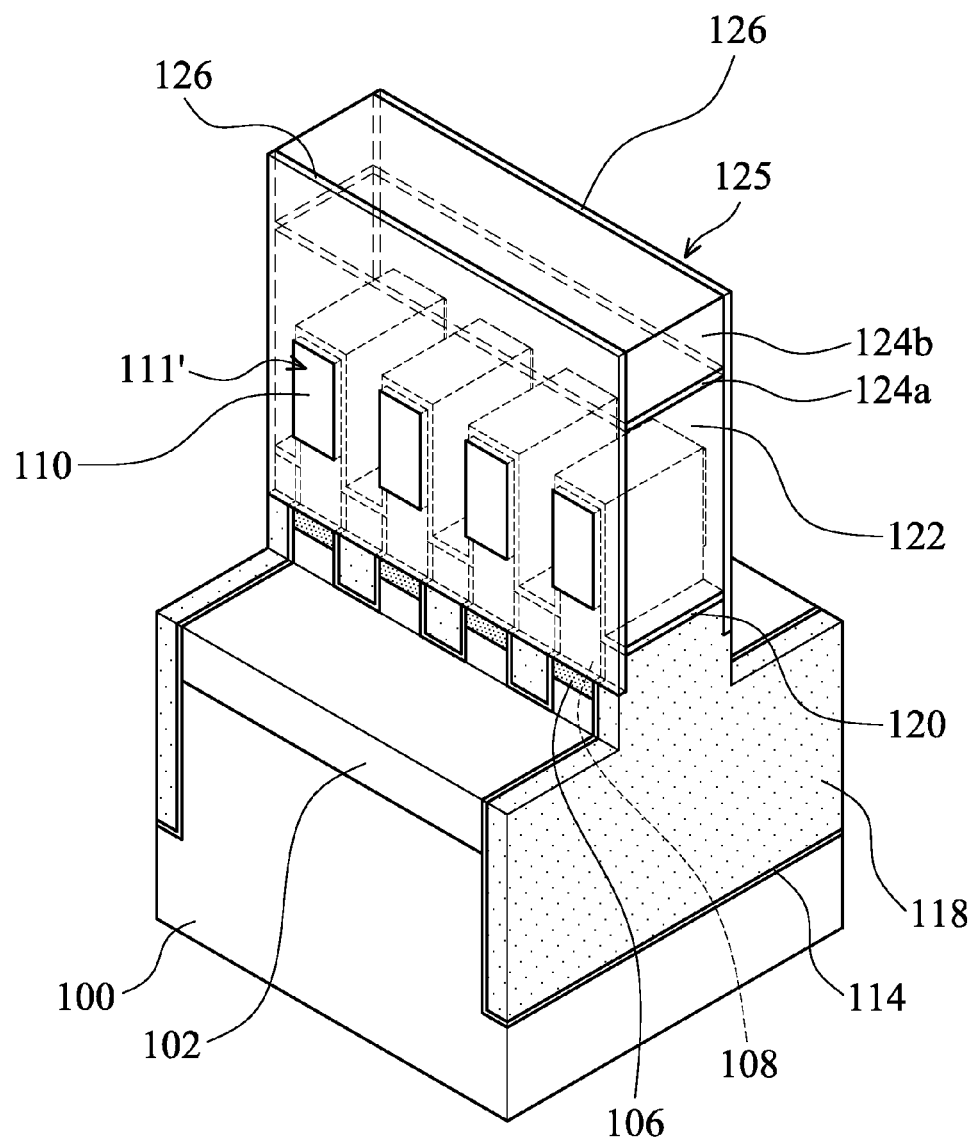
Figure 10B:
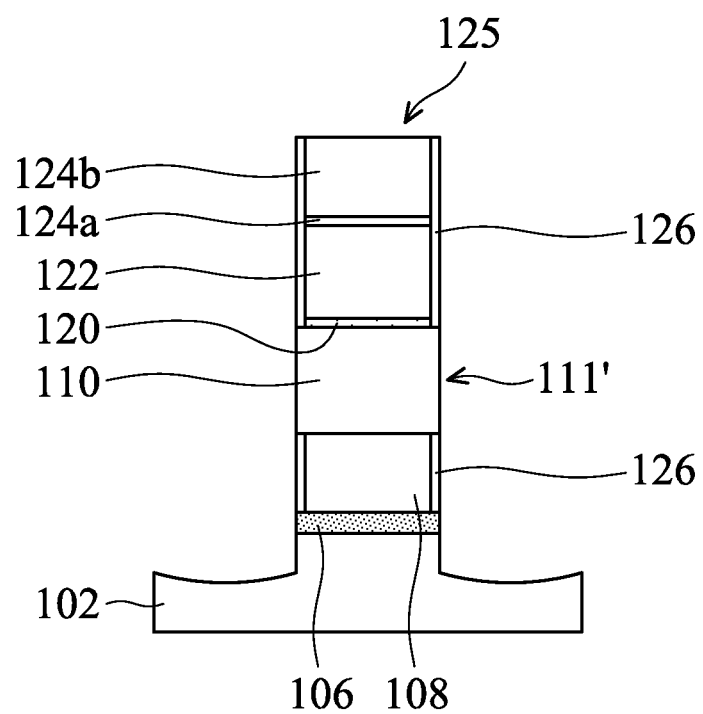

As shown in FIGS. 10A and 10B, the spacer layer 126, the fin structures 111, and the blocking layer 106 are partially removed to expose the doped region 102, in accordance with some embodiments. Some elements covered by the spacer layer 126 are illustrated as dashed lines in FIG. 10A. Multiple etching processes may be used to partially remove the spacer layer 126, the fin structures 111, and the blocking layer 106.

The remaining portions of the fin structures 111 surrounded by the dummy gate stack 125 serve as fin channel structures 111', as shown in FIGS. 10A and 10B. After subsequent formation processes, the fin channel structures 111' are used as channel regions of the FinFET device. In some embodiments, the doped region 102 in the semiconductor substrate 100 is also partially removed, as shown in FIGS. 10A and 10B. After the etching processes, space is created for a subsequent formation process of source/drain structures.

In some embodiments, the fin structures 111 are partially removed after the spacer layer 126 is partially removed. In some embodiments, the blocking layer 106 is partially removed after the partial removal of the isolation feature 118 and the liner layer 114. Then, the doped region 102 is also partially removed. As shown in FIGS. 10A and 10B, remaining portions of the blocking layer 106 are under the fin channel structures 111' and the dummy gate stack 125, in accordance with some embodiments.

Figure 11A:
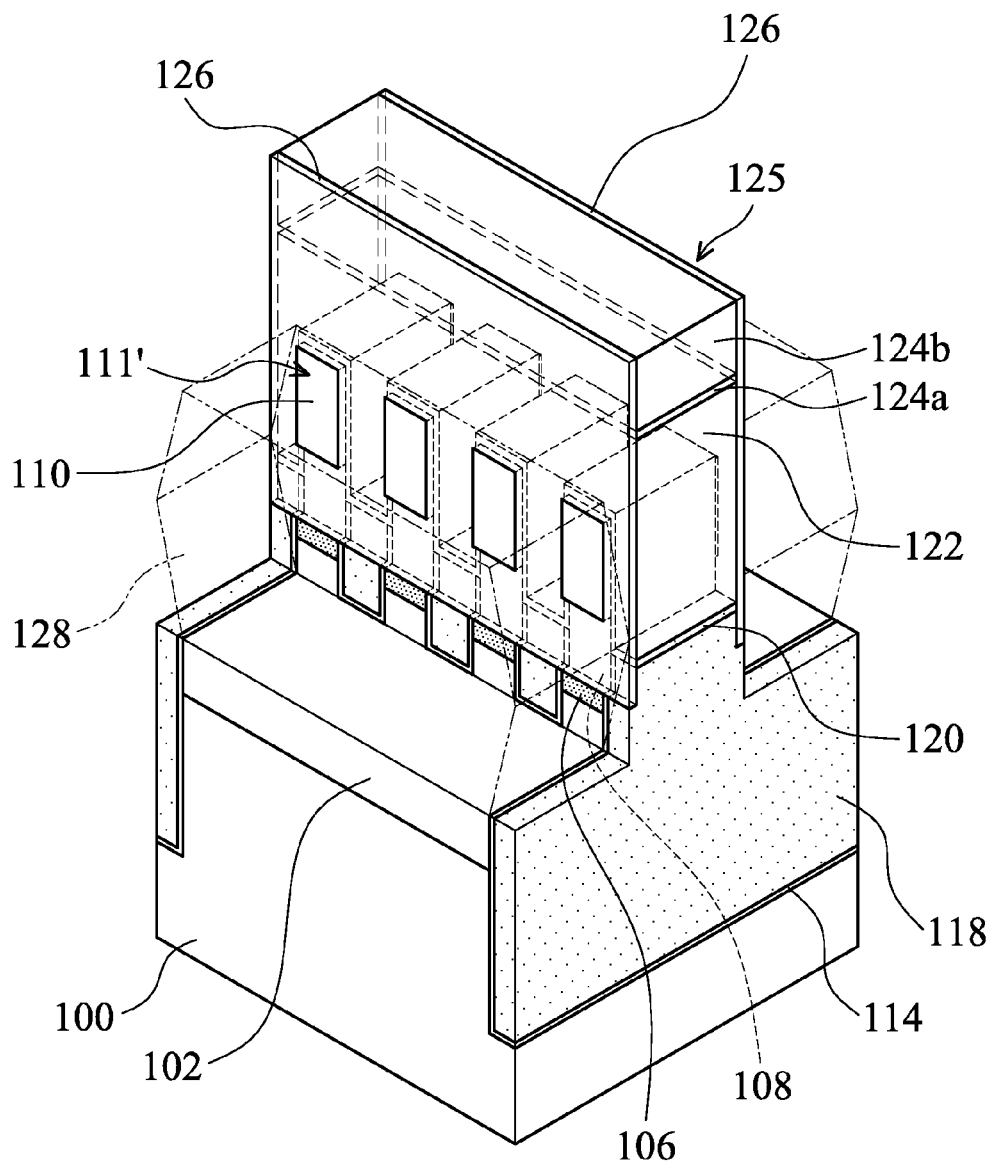
Figure 11B:
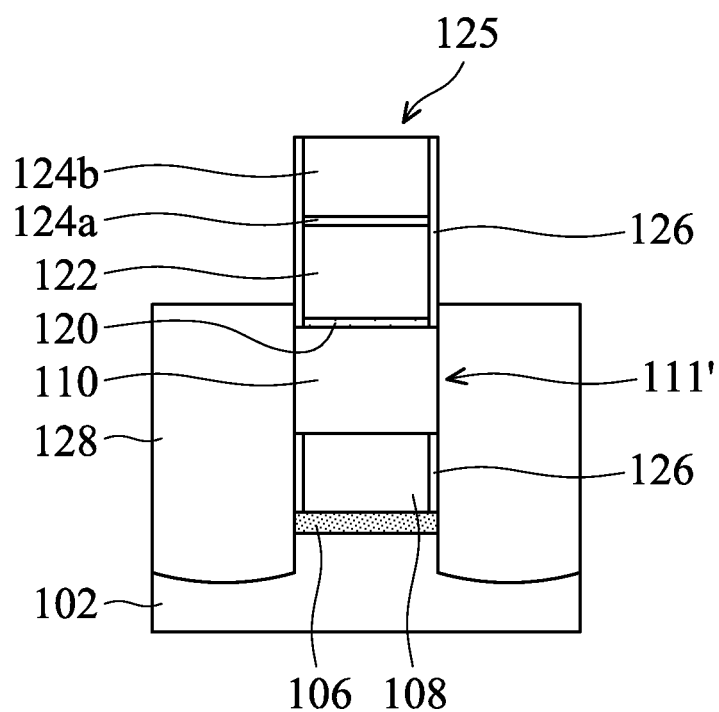

Referring to FIGS. 11A and 11B, source/drain structures 128 are respectively formed over the doped regions 102, in accordance with some embodiments. For illustration purpose, the source/drain structures 128 are illustrated as dashed lines so that the elements covered by the source/drain structures 128 are still visible in FIG. 11A. The source/drain structures 128 adjacent to the fin channel structures 111' may provide stress or strain to the fin channel structures 111' under the dummy gate stack 125. As a result, the carrier mobility of the device and device performance are improved.

Figure 12A:
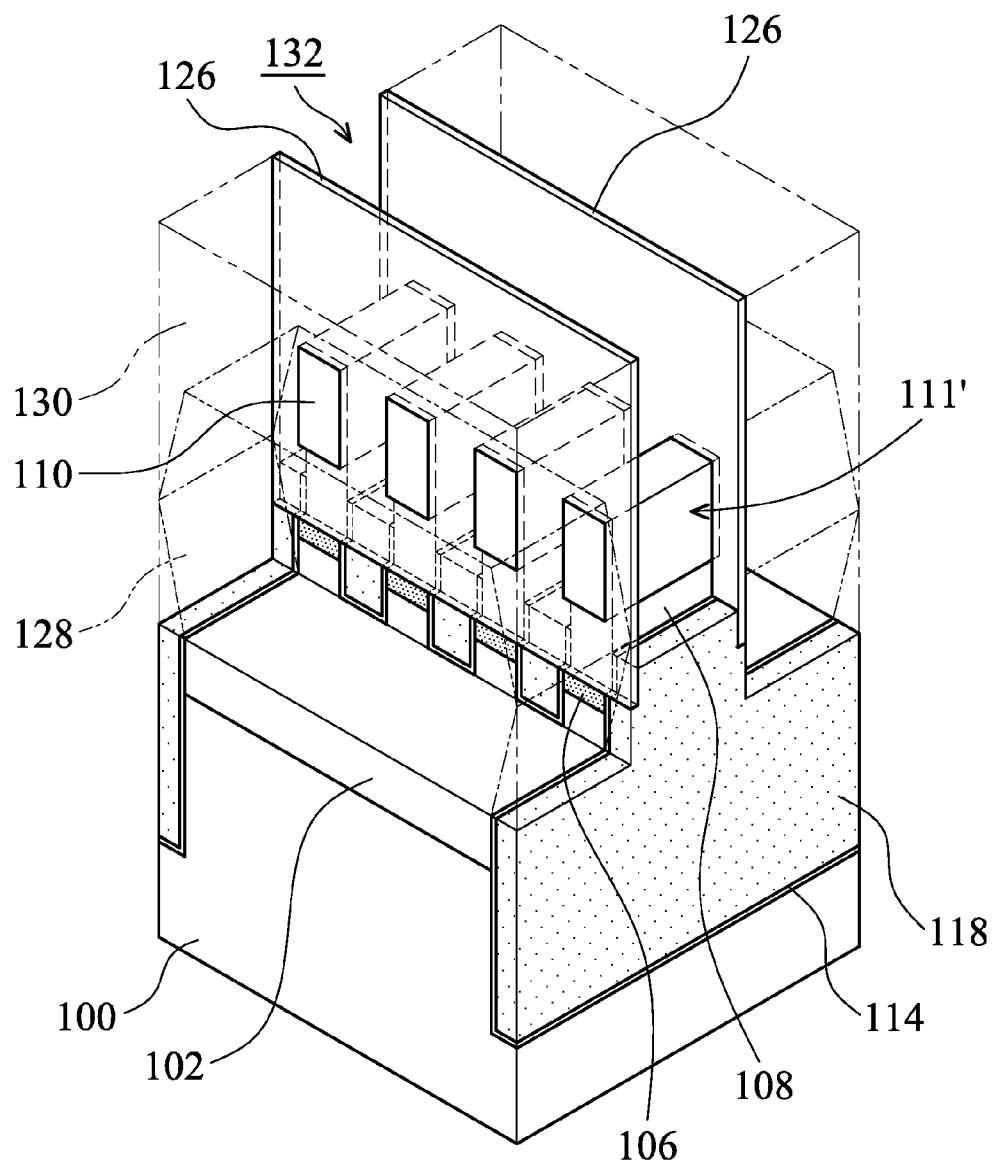
Figure 12B:
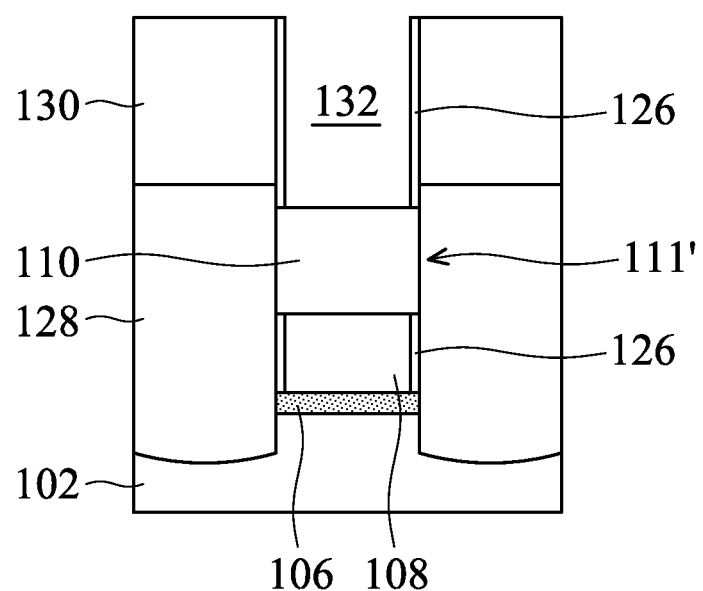

In some embodiments, each of the source/drain structures 128 is in direct contact with one or more of fin channel structures, as shown in FIGS. 12A and 12B. In some embodiments, the source/drain structures 128 are also in direct contact with the spacer layer 126 and the blocking layer 106. In some embodiments, the source/drain structures 128 are in direct contact with the doped regions 102 in the semiconductor substrate 100. The doped regions 102 may serve as an anti-punch-through region to prevent current leakage between neighboring source/drain structures 128.

In some other embodiments, the source/drain structures 128 are p-type regions. For example, the source/drain structures 128 may include epitaxially grown silicon germanium or silicon germanium doped with boron. In some of these cases, the doped region 102 is an n-type region. It should be appreciated, however, that the source/drain structures 128 are not limited to being p-type regions. In some embodiments, the source/drain structures 128 are n-type regions. The source/drain structures 128 may include epitaxially grown silicon, epitaxially grown silicon carbide (SiC), epitaxially grown silicon phosphide (SiP), or another suitable epitaxially grown semiconductor material. In some of these cases, the doped region 102 is a p-type region.

In some embodiments, the source/drain structures 128 are formed by using a selective epitaxial growth (SEG) process, a CVD process (e.g., a vapor-phase epitaxy (VPE) process, a low pressure chemical vapor deposition (LPCVD) process, and/or an ultra-high vacuum CVD (UHV-CVD) process), a molecular beam epitaxy process, another applicable process, or a combination thereof.

In some embodiments, the source/drain structures 128 are doped with one or more suitable dopants. For example, the source/drain structures 128 are SiGe source/drain features doped with boron (B) or another suitable dopant. Alternatively, in some other embodiments, the source/drain structures 128 are Si source/drain features doped with phosphor (P), antimony (Sb), or another suitable dopant.

In some embodiments, the source/drain structures 128 are doped in-situ during their epitaxial growth. In some other embodiments, the source/drain structures 128 are not doped during the growth of the source/drain structures 128. Instead, after the formation of the source/drain structures 128, the source/drain structures 128 are doped in a subsequent process. In some embodiments, the doping is achieved by using an ion implantation process, a plasma immersion ion implantation process, a gas and/or solid source diffusion process, another applicable process, or a combination thereof. In some embodiments, the source/drain structures 128 are further exposed to one or more annealing processes to activate the dopants. For example, a rapid thermal annealing process is used.

Afterwards, a dielectric layer 130 is deposited over the dummy gate stack 125 and the source/drain structures 128, as shown in FIGS. 12A and 12B in accordance with some embodiments. The dielectric layer 130 serves as an interlayer dielectric layer. A planarization process is then performed to remove the upper portion of the dielectric layer 130 and the hard masks 124a and 124b until the dummy gate electrode 122 is exposed. Afterwards, multiple etching processes are used to remove the dummy gate electrode 122 and the dummy layer 120 to form a recess 132, as shown in FIGS. 12A and 12B in accordance with some embodiments. The recess 132 exposes the fin channel structures 111' and the portion of the semiconductor layer 108 not covered by the spacer layer 126 and the liner layer 114.

Figure 13A:
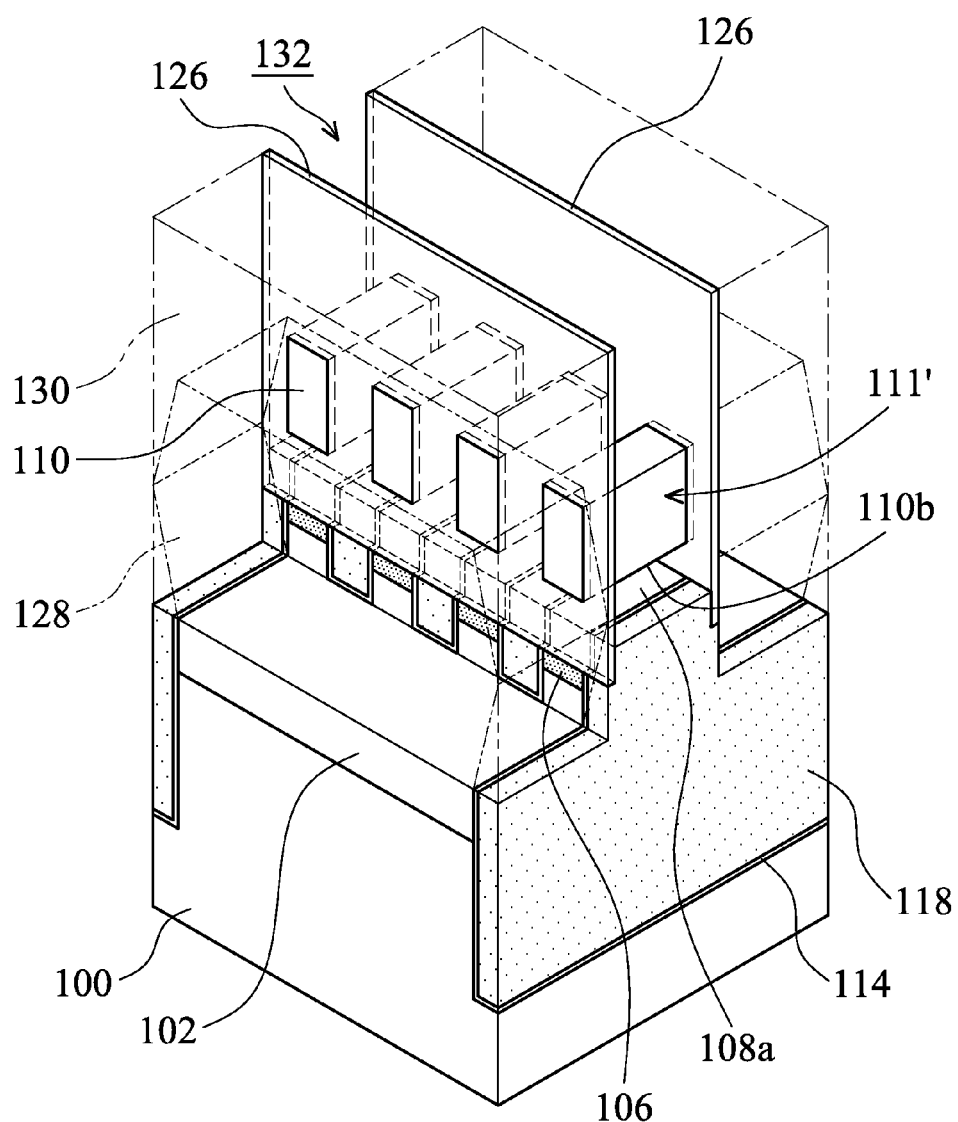
Figure 13B:
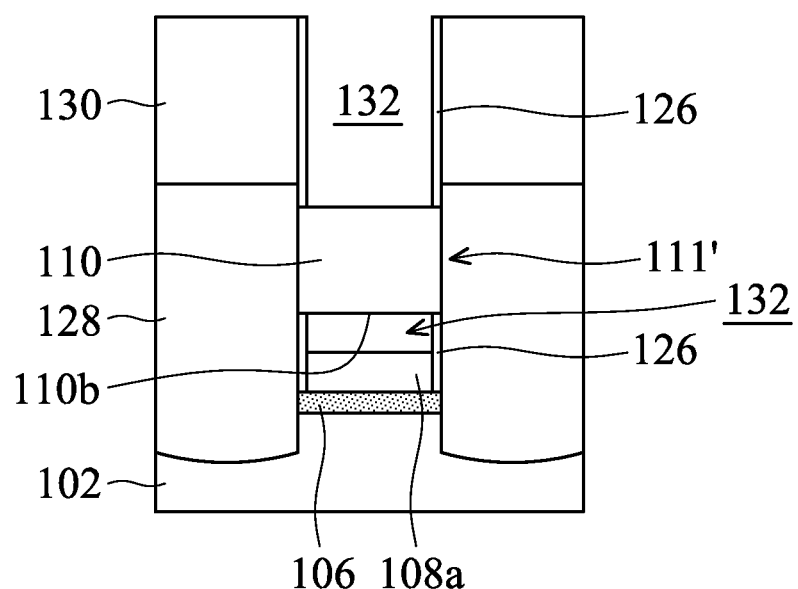

As shown in FIGS. 13A and 13B, the exposed portion of the semiconductor layer 108 is removed to expose lower surfaces 110b of the semiconductor layer 110 (fin channel structures 111'), in accordance with some embodiments. In some embodiments, an etching process is performed to etch the semiconductor layer 108 from its side surface exposed by the recess 132. After the etching process, semiconductor features 108a are formed, as shown in FIGS. 13A and 13B. The semiconductor features 108a are the remaining portions of the semiconductor layer 108 after the etching process. As shown in FIGS. 13A and 13B, the fin channel structures 111' are separated from the semiconductor features 108a. The recess 132 further extends under the fin channel structures 111' to allow the lower surfaces 110b to be exposed.

Figure 14A:
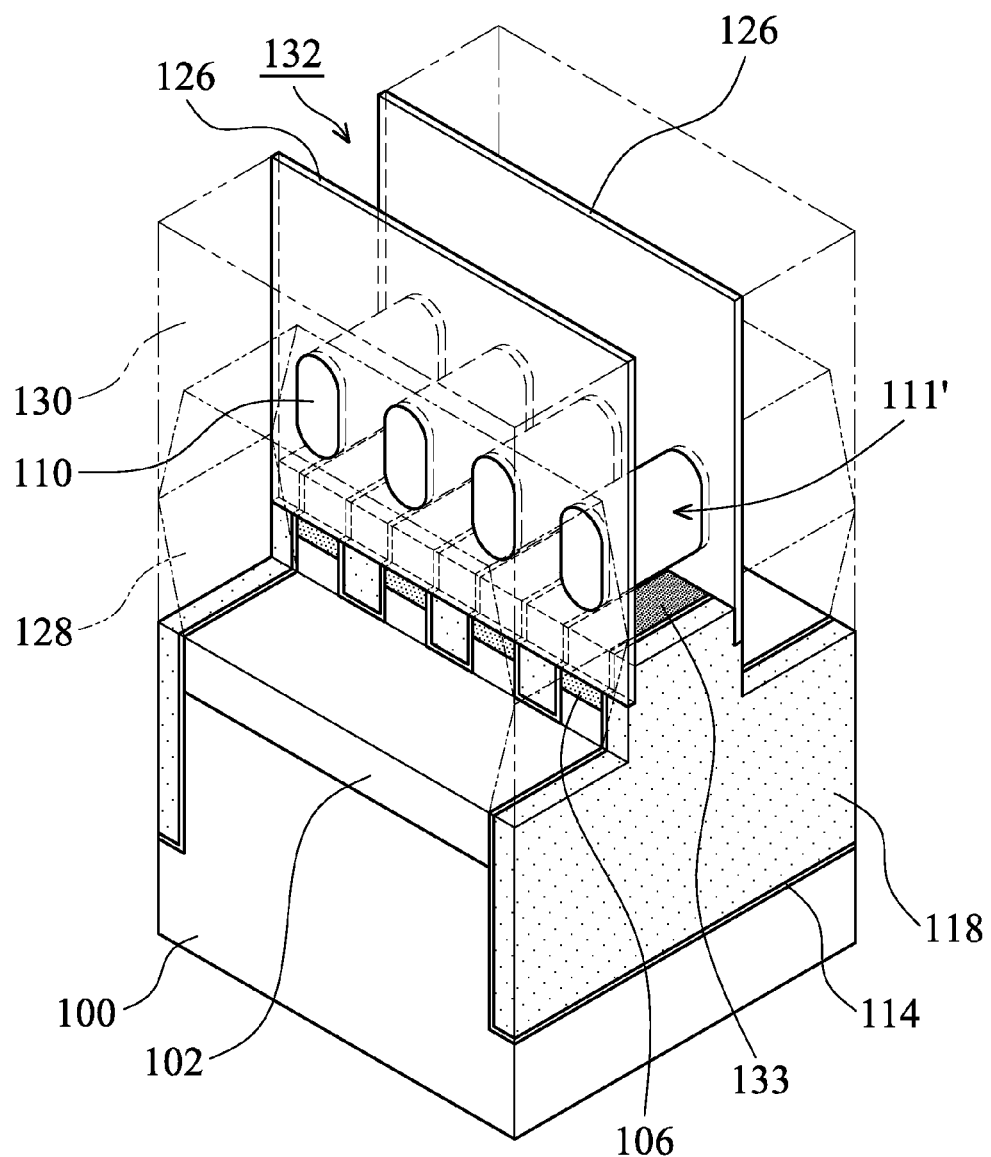
Figure 14B:
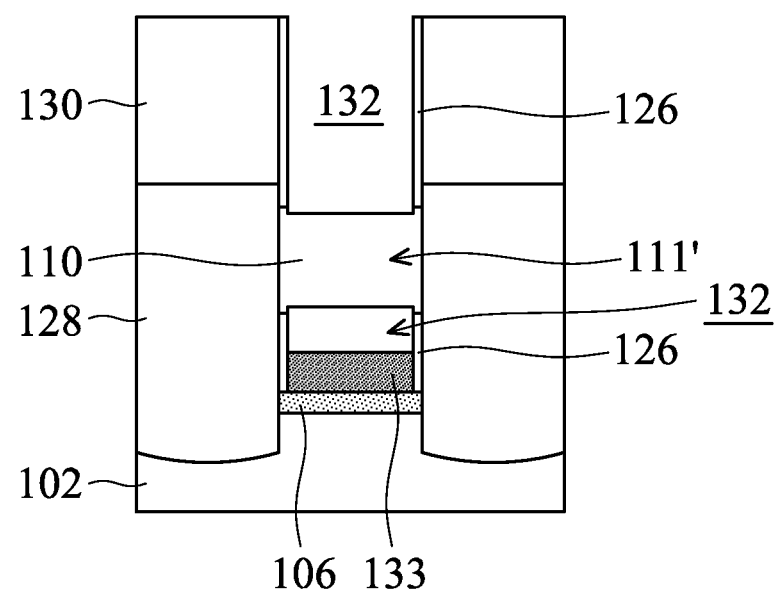

As shown in FIGS. 14A and 14B, the semiconductor features 108a are oxidized to form isolation layers 133, in accordance with some embodiments. In some embodiments, the isolation layers 133 are made of silicon germanium oxide or another semiconductor oxide. In some embodiments, each of the isolation layers 133 has a thickness that is in a range from about 2 nm to about 10 nm.

In some embodiments, a heat treatment is performed on the structure shown in FIGS. 13A and 13B in an oxygen-containing atmosphere until the semiconductor features 108a are oxidized to form the isolation layers 133. In some embodiments, the oxygen-containing atmosphere is a water-containing atmosphere. The heat treatment may be performed at a temperature that is in a range from about 400 degrees C. to about 500 degrees C.

As mentioned above, in some embodiments, the semiconductor layer 108 (which forms the semiconductor features 108a) is made of a semiconductor material that is more easily oxidized than that of the semiconductor layer 110 (which forms the fin channel structures 111') under the same atmosphere for oxidation. Therefore, by fine-tuning the atmosphere for oxidation, the fin channel structures 111' are substantially not oxidized or only slightly oxidized even if the semiconductor features 108a are oxidized.

In some cases, surface portions of the fin channel structures 111' are also oxidized. A cleaning operation may be performed to remove the oxidized portions of the fin channel structures 111'. For example, a cleaning solution is applied on the fin channel structures 111' to remove the oxidized portions. After the removal of the oxidized portions, the fin channel structures 111' are shaped to have curved surfaces or relatively rounded profiles, as shown in FIGS. 14A and 14B in accordance with some embodiments. The quality and reliability of the fin channel structures 111' may be improved.

Figure 15A:
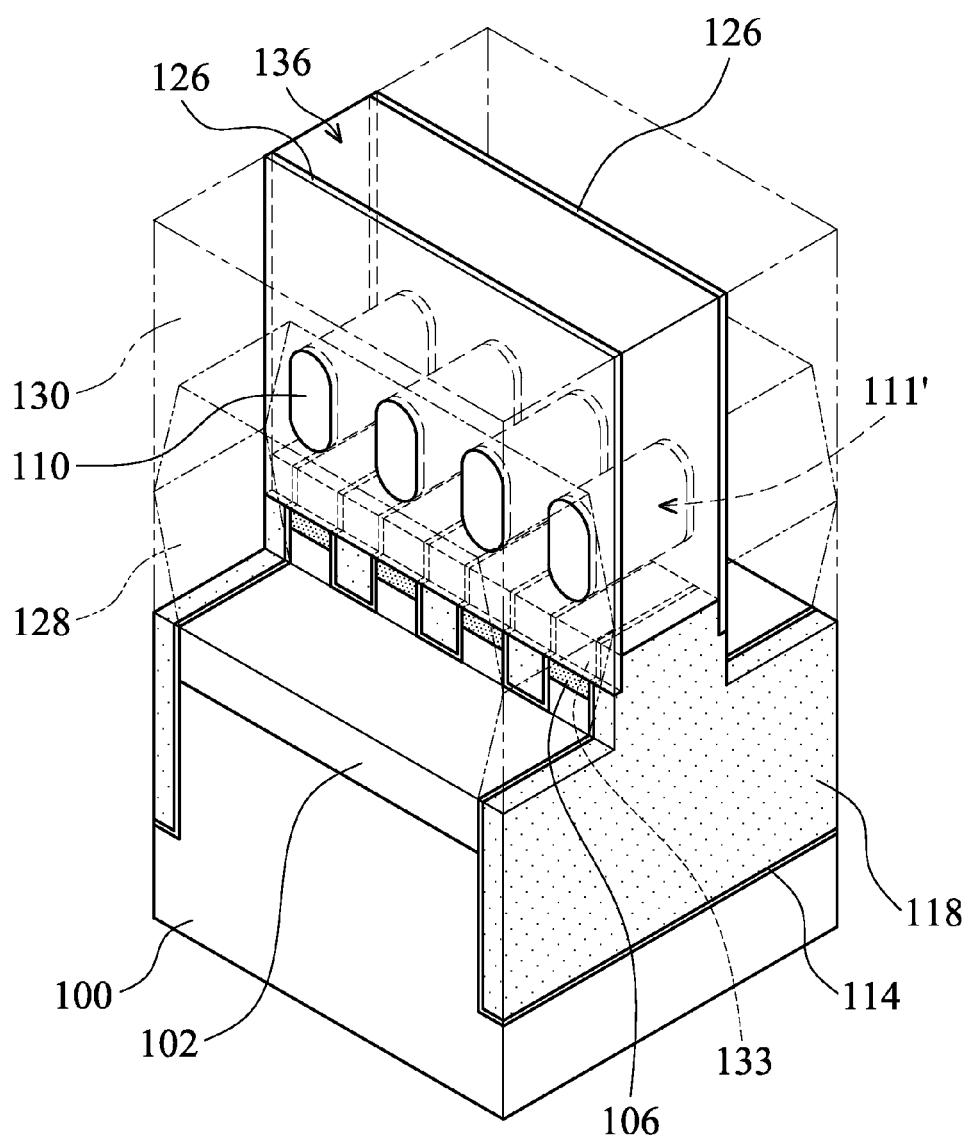
Figure 15B:
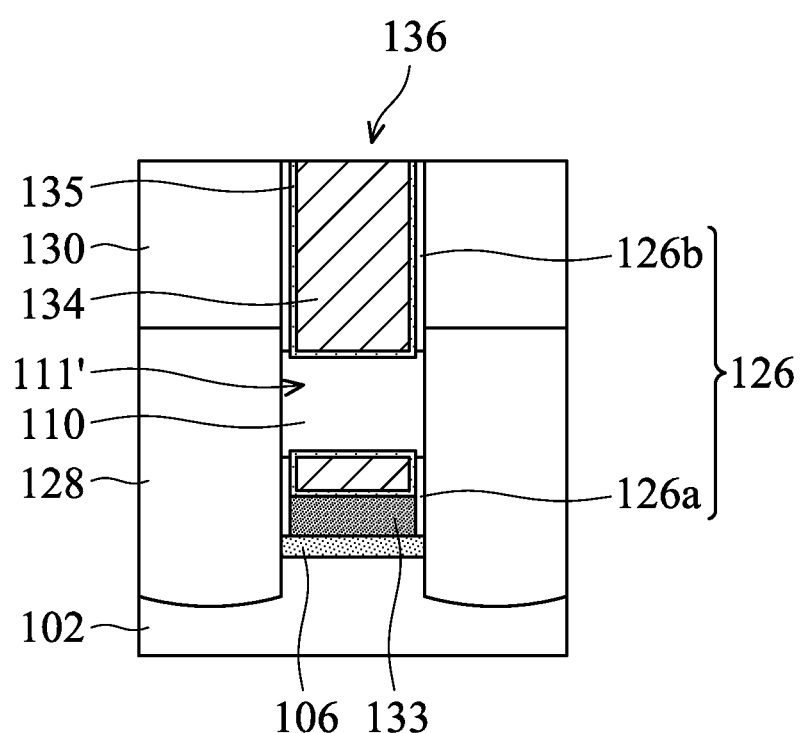

As shown in FIGS. 15A and 15B, a gate stack 136 is formed in the recess 132, in accordance with some embodiments. In some embodiments, the gate stack 136 encircles the fin channel structures 111', which allow the gate stack 136 to control the fin channel structures 111' from multiple sides (four or more sides) of the fin channel structures 111'. The gate stack 136 includes a gate dielectric layer 135 and a metal gate electrode 134, as shown in FIG. 15B. In some embodiments, the gate dielectric layer 135 includes a high-k material, and the metal gate electrode 134 includes one or more work function layers and one or more metal filling layers. Multiple deposition processes and a planarization process may be used to form the gate stack 136.

As shown in FIGS. 15A and 15B, the isolation layers 133 between the gate stack 136 and the blocking layer 106 provide further isolation between the metal gate electrode 134 and the semiconductor substrate 100. Furthermore, as shown in FIGS. 15A and 15B, the spacer layer 126 includes a first portion 126a and a second portion 126b. The portion 126a of the spacer layer 126 serves as an isolation layer that electrically isolates the metal gate electrode 134 of the gate stack 136 from the adjacent source/drain structures 128. In some embodiments, the portion 126a of the spacer layer 126 is in direct contact with the isolation layer 133, as shown in FIGS. 15A and 15B. In some embodiments, the blocking layer 106 is also in direct contact with the spacer layer 126 and the isolation layer 133. In some embodiments, the isolation layer 133 and the spacer layer 126 are made of different materials. For example, the isolation layer 133 is made of silicon germanium oxide, and the spacer layer 126 is made of silicon carbon nitride.

In embodiments of the disclosure, because the implantation process for forming the doped region 102 (APT region) is performed before the formation of the fin channel structures 111', the fin channel structures 111' are prevented from being damaged or negatively affected by the ion implantation process. In some embodiments, the fin channel structures 111' are substantially free of dopants. The doped region 102 may contain a higher amount of dopants to provide a better function. Moreover, the blocking layer 106 may further block the dopants in the doped region 102 from diffusing into the fin channel structures 111' which are formed later. Device quality and reliability are therefore improved.

Figure 16:
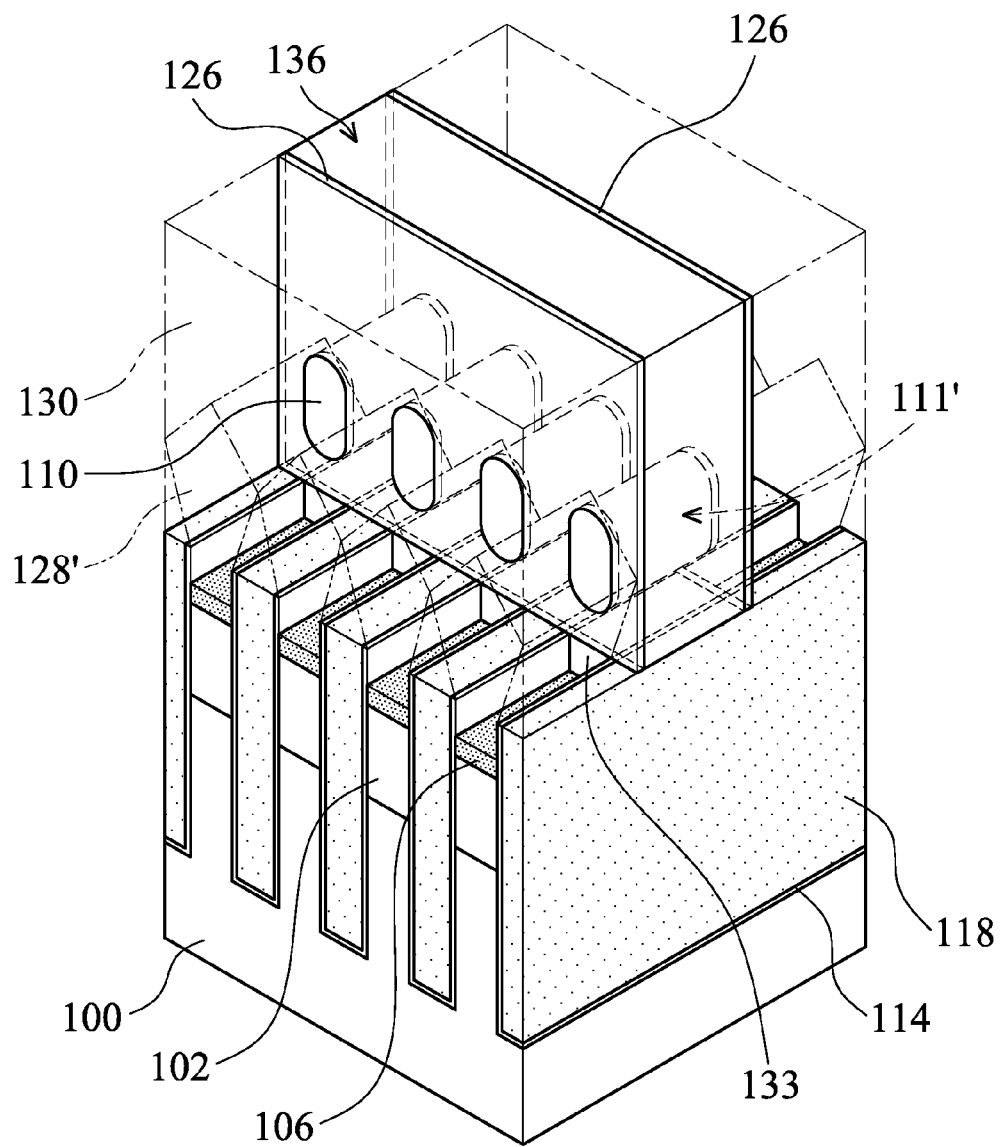
FIG. 16 is a perspective view of a semiconductor device structure, in accordance with some embodiments.

In some embodiments mentioned above, each of the source/drain structures 128 is in direct contact with multiple fin channel structures 111'. The semiconductor device structure thus has a "crown scheme", as shown in FIG. 15A. However, it should be appreciated that many variations and modifications can be made to embodiments of the disclosure. For example, the source/drain structure is not limited to having the "crown scheme" and may be in direct contact with only one fin channel structure. FIG. 16 is a perspective view of a semiconductor device structure, in accordance with some embodiments. As shown in FIG. 16, multiple source/drain structures 128' are formed, in accordance with some embodiments. The source/drain structures 128' are illustrated as dashed lines in FIG. 16 for a better understnding of the structure. In these cases, each of the fin channel structures 111' is in direct contact with one corresponding source/drain structure 128'.

In some embodiments mentioned above, the gate stack 136 encircles four or more sides of the fin channel structures 111'. A portion of the gate stack 136 is positioned between the fin channel structures 111' and the semiconductor substrate 100. However, it should be appreciated that embodiments of the disclosure are not limited thereto. In some other embodiments, the gate stack 136 only surrounds three sides or one side of the fin channel structures 111'. In some of these cases, the gate stack 136 has no portion positioned between the fin channel structures and the semiconductor substrate 100.

Embodiments of the disclosure form a doped region (or an anti-punch-through region) between a semiconductor substrate and a channel structure (such as a fin channel structure) of a semiconductor device to reduce or prevent leakage current. The implantation process for forming the doped region (or an anti-punch-through region) is performed before the formation of the channel structure. The channel structure is prevented from being damaged by the implantation process. In some cases, a blocking layer is formed over the doped region before the formation of the channel structure. The blocking layer blocks the dopants in the doped region from diffusing into the channel structure, which is formed later. Therefore, the quality and reliability of the channel structure is further improved. Accordingly, the semiconductor device also has a higher level of performance.

In accordance with some embodiments, a semiconductor device structure is provided. The semiconductor device structure includes a semiconductor substrate and a fin channel structure over the semiconductor substrate. The semiconductor device structure also includes a gate stack covering a portion of the fin channel structure. The semiconductor device structure further includes a source/drain structure adjacent to the fin channel structure and a doped region between the semiconductor substrate and the fin channel structure. In addition, the semiconductor device structure includes a blocking layer between the fin channel structure and the doped region.

In accordance with some embodiments, a semiconductor device structure is provided. The semiconductor device structure includes a semiconductor substrate and multiple fin channel structures over the semiconductor substrate. The semiconductor device structure also includes a gate stack covering portions of the fin channel structures. The semiconductor device structure further includes a source/drain structure adjacent to one of the fin channel structures and a doped region between the semiconductor substrate and one of the fin channel structures. In addition, the semiconductor device structure includes a blocking layer between one of the fin channel structures and the doped region.

In accordance with some embodiments, a method for forming a semiconductor device structure is provided. The method includes forming an anti-punch-through region over a semiconductor substrate. The method also includes forming a fin channel structure and a gate stack over the anti-punch-through region. The gate stack covers a portion of the fin channel structure. The method further includes forming a source/drain structure adjacent to the fin channel structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
   a semiconductor substrate;
   a fin channel structure over the semiconductor substrate;
   a gate stack covering a portion of the fin channel structure, wherein the gate stack comprises a gate dielectric layer and a metal gate electrode;
   a source/drain structure adjacent to the fin channel structure;
   a doped region between the semiconductor substrate and the fin channel structure;
   a blocking layer between the fin channel structure and the doped region, wherein a portion of the gate stack is between the fin channel structure and the blocking layer;
   an isolation layer between the blocking layer and the gate stack, wherein a top surface of the isolation layer is below a top surface of the source/drain structure; and
   a second isolation layer between the gate stack and the source/drain structure.

2. The semiconductor device structure as claimed in claim 1, wherein the doped region is an anti-punch-through region.

3. The semiconductor device structure as claimed in claim 2, wherein the source/drain structure is a p-type region, and the doped region is an n-type region.

4. The semiconductor device structure as claimed in claim 1, wherein the blocking layer comprises silicon carbide, silicon germanium carbide, silicon, or a combination thereof.

5. The semiconductor device structure as claimed in claim 1, wherein the fin channel structure has an upper surface and a lower surface opposite to the upper surface, the lower surface is between the upper surface and the blocking layer, and the gate stack encircles the lower surface of the fin channel structure.

6. The semiconductor device structure as claimed in claim 5, wherein the isolation layer is between the blocking layer and the fin channel structure.

7. The semiconductor device structure as claimed in claim 1, wherein the isolation layer comprises silicon geranium oxide.

8. The semiconductor device structure as claimed in claim 1, wherein a top surface of the second isolation layer is higher than a top surface of the fin channel structure.

9. The semiconductor device structure as claimed in claim 1, wherein the isolation layer is in direct contact with the second isolation layer.

10. The semiconductor device structure as claimed in claim 1, wherein the isolation layer and the second isolation layer are made of different materials.

11. The semiconductor device structure as claimed in claim 1, wherein the fin channel structure has a rounded profile.

12. The semiconductor device structure as claimed in claim 1, wherein the fin channel structure has a first portion and a second portion, an entire surface of the second portion is encircled by the gate stack, the first portion is between the second portion and the source/drain structure, and the first portion extends from the second portion to cover a side surface of the gate stack.

13. The semiconductor device structure as claimed in claim 1, wherein the blocking layer is in direct contact with the isolation layer and the second isolation layer.

14. The semiconductor device structure as claimed in claim 1, wherein the isolation layer is in direct contact with the blocking layer.

15. A semiconductor device structure, comprising:
    a semiconductor substrate;
    a plurality of fin channel structures over the semiconductor substrate;
    a gate stack covering portions of the fin channel structures, wherein the gate stack comprises a gate dielectric layer and a metal gate electrode;
    a source/drain structure adjacent to one of the fin channel structures;
    a doped region between the semiconductor substrate and one of the fin channel structures;
    a blocking layer between one of the fin channel structures and the doped region, wherein a portion of the gate stack is between the blocking layer and one of the fin channel structures;
    an isolation layer between the blocking layer and the gate stack, wherein a top surface of the isolation layer is below a top surface of the source/drain structure; and
    a second isolation layer between the gate stack and the source/drain structure.

16. The semiconductor device structure as claimed in claim 15, further comprising a second source/drain structure in direct contact with one of the fin channel structures.

17. The semiconductor device structure as claimed in claim 15, wherein the gate stack encircles the fin channel structures.

18. The semiconductor device structure as claimed in claim 15, wherein the gate stack comprises a gate dielectric layer and a metal gate electrode.

19. A semiconductor device structure, comprising:
    a semiconductor substrate;
    a fin channel structure over the semiconductor substrate;
    a gate stack continuously encircling a portion of the fin channel structure such that a portion of the gate stack is between the fin channel structure and the semiconductor substrate, wherein the gate stack comprises a gate dielectric layer and a metal gate electrode;
    a source/drain structure connected to the fin channel structure;
    a doped region between the semiconductor substrate and the fin channel structure, wherein the doped region is between the source/drain structure and the semiconductor substrate;
    a blocking layer between the fin channel structure and the doped region;

an isolation layer between the blocking layer and the gate stack, wherein a top surface of the isolation layer is below a top surface of the source/drain structure; and a second isolation layer between the gate stack and the source/drain structure.

20. The semiconductor device structure as claimed in claim 19, wherein the isolation layer is in direct contact with the blocking layer.

* * * * *